United States Patent [19]

Crafts

[11] Patent Number: 5,444,401
[45] Date of Patent: Aug. 22, 1995

[54] CURRENT LIMITED OUTPUT DRIVER FOR A GATE ARRAY CIRCUIT

[75] Inventor: Harold S. Crafts, Colorado Springs, Colo.

[73] Assignees: AT&T Global Information Solutions Company, Dayton, Ohio; Hyundai Electronics America, Milpitas, Calif.

[21] Appl. No.: 198,656

[22] Filed: Feb. 17, 1994

Related U.S. Application Data

[63] Continuation of Ser. No. 996,994, Dec. 28, 1992, abandoned.

[51] Int. Cl.⁶ .......................... H03K 3/00; G05F 1/10
[52] U.S. Cl. ..................... 327/108; 327/362; 327/546
[58] Field of Search ............... 307/491, 475, 279, 256, 307/270, 296.1

[56] References Cited

U.S. PATENT DOCUMENTS

| | | | |
|---|---|---|---|
| 4,962,345 | 10/1990 | Crafts et al. | 307/270 |
| 4,965,468 | 10/1990 | Nicollini et al. | 307/279 |
| 4,975,758 | 12/1990 | Crafts | 357/45 |
| 5,043,604 | 8/1991 | Komaki | 307/475 |
| 5,066,872 | 11/1991 | Schenck | 307/542 |
| 5,121,013 | 6/1992 | Chuang et al. | 307/542 |
| 5,151,619 | 9/1992 | Austin et al. | 307/475 |

Primary Examiner—Margaret Rose Wambach
Attorney, Agent, or Firm—Wayne P. Bailey; Jack R. Penrod

[57] ABSTRACT

An output driver that has and output current that is independent of supply voltage, load capacitance, temperature and processing variables as long as their variation from the norm is limited. This current limited output driver is specially adapted for gate array integrated circuits. The output driver uses two reference voltages to limit the output current and a pulldown transistor to ensure that logic low is achieved despite voltage, load capacitance, temperature and processing variations.

6 Claims, 3 Drawing Sheets

CURRENT LIMITED OUTPUT DRIVER FOR A GATE ARRAY CIRCUIT

This is a continuation of application Ser. No. 07/996,994 filed Dec. 28, 1992, now abandoned.

BACKGROUND OF THE INVENTION

The present invention relates to an output driver for a CMOS integrated circuit, and more particularly to such a driver that has reduced susceptibility to ground bounce and electromagnetic interference.

In CMOS integrated circuits, there is a class of circuits known as gate arrays. Gate arrays are manufactured on a substrate containing all of the diffusion regions required for the device. These diffusion regions form transistors, mostly field effects transistors (FETs), that are arranged in arrays. The design process consists of interconnecting individual FETs and groups of FETs into binary gates that provide the desired binary functions. Since CMOS is a high density technology, very complex functions may be realized. Further, there are logic design languages and software that allows the designer to quickly and cost effectively fulfill binary circuit functions using CMOS gate arrays.

As often happens, the functions performed by a gate array integrated circuit are connected to a transistor-transistor logic (TTL) circuit. Thus, the output drivers of a gate array circuit should be capable of driving a TTL input by sufficiently sourcing and sinking current to drive the TTL input and charge the conductor connecting the CMOS output to the TTL input. The standard design of a CMOS output driver to meet the TTL drive specifications results in a CMOS output driver that will draw several times the specified current at output voltages between one and two volts. This excessive current causes noise problems in the CMOS gate array output driver circuit, in the TTL input circuit and in the system that both circuits are part of. This type of noise is referred to as ground bounce for noise on the low voltage side of the power bus of the gate array integrated circuit and power supply noise for the high voltage side of the power bus.

These noise problems are related to the fact that multiple output drivers draw current through one or more common pins connecting the gate array with the high side and low side of the system power supply. One previous solution has been to increase the number of power supply pins per gate array integrated circuit. There is an economic limit to such an approach, however, because for every pin of a package that is used for power supply connection, there is one less pin available to carry a logic signal into or out of the integrated circuit for logic processing. Thus, as long as there are less than two power supply pins for each binary output pin, there will be some of this type of noise problem.

Another solution to the ground bounce and power supply noise problem is to dynamically limit the current that is sourced or sunk by the output driver circuits. Known dynamic limiting circuits are sensitive to circuit parameters such as supply voltage level, transistor transconductance and the bulk resistivity of poly-silicon or single crystal silicon. Such circuits may work satisfactorily at specific supply voltages or load types, but they do not work well over a broad range of temperatures, power supply voltages, load, and manufacturing process variations that gate arrays are subject to.

It is an object of the present invention to provide a constant current output driver.

It is another object of the present invention to provide such an output driver that rapidly switches through the high current drawing portion of its operating curve and thereby limit the amount of current drawn and ground bounce/power supply noise generated.

SUMMARY OF THE INVENTION

Briefly stated, in accordance with one aspect of the invention the foregoing objects are achieved by providing an output driver whose output current is independent of supply voltage, load capacitance, temperature and processing variables as long as they are within specification limits.

In one aspect of the invention, the aforementioned objects are achieved by providing an output pad driver having a series connection of two P-FETs in series with a series connection of two N-FETs and this four transistor series is connected between a positive supply voltage and a ground voltage. The gates of the FETs having a channel electrode connected to the voltages are connected together and driven as a binary data input. As for the middle two FETs, the P-FET has its gate connected to a more positive reference voltage and the N-FET has its gate connected to a less positive reference voltage. The output pad is connected to the junction of the channel electrode of the middle P-FET and the channel electrode of the middle N-FET. Further, an active pull down circuit that provides additional current conducting capability is connected to the output pad.

BRIEF DESCRIPTION OF THE DRAWINGS

While the specification concludes with the appended claims particularly pointing out and distinctly claiming the subject matter which is regarded as the invention, it is believed that the invention will be better understood from the following description taken in conjunction with the accompanying drawings in which:

DETAILED DESCRIPTION

Figure 1:
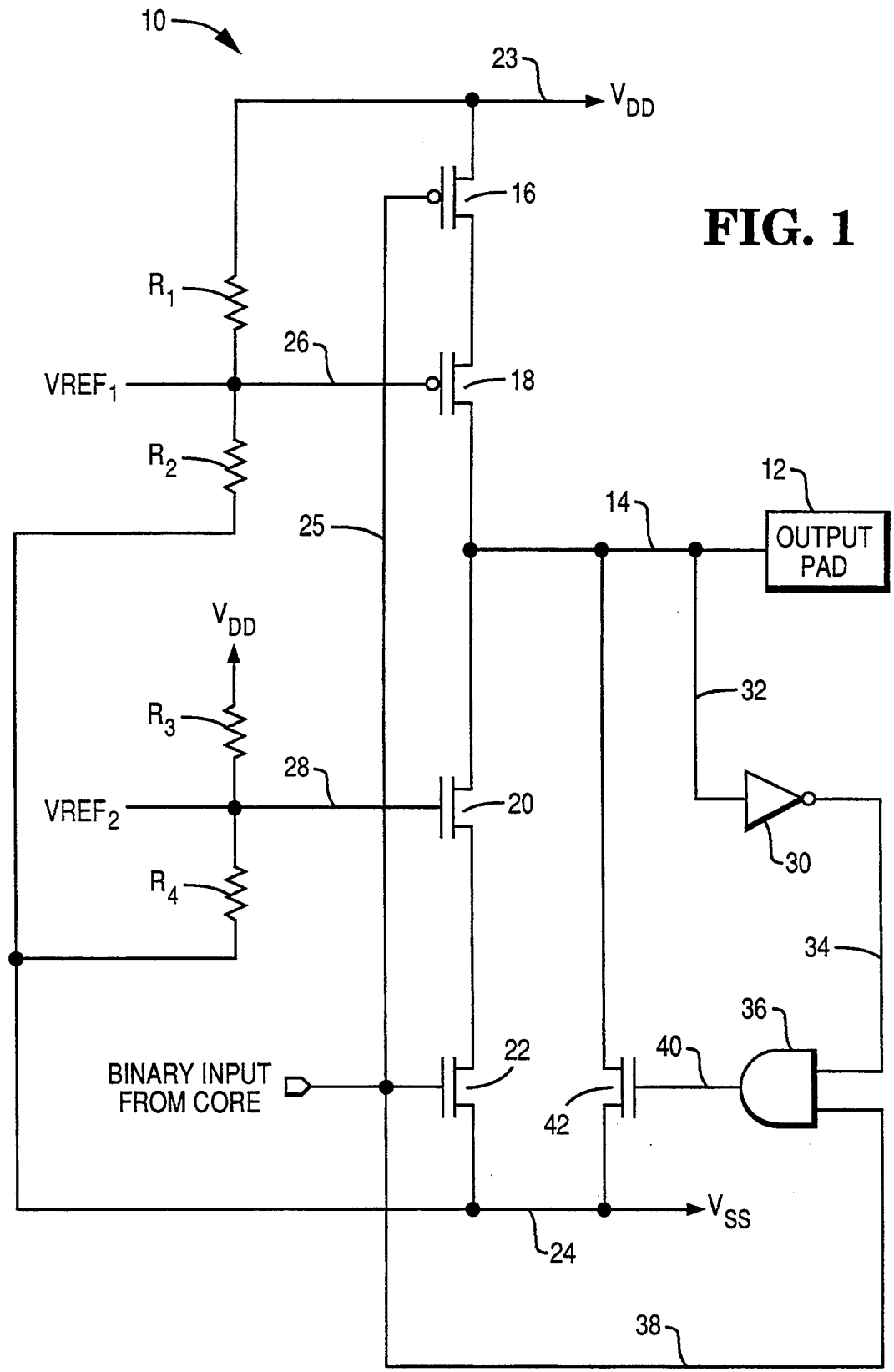
FIG. 1 is a schematic diagram of an output driver circuit according to the present invention.

Referring now to FIG. 1, a low noise, current limited CMOS output driver 10 is shown. Output driver 10 is connected to an output pad 12 of a larger integrated circuit (not shown), such as a gate array, that it is a part of. Output driver 10 is connected to output pad 12 via line 14.

Output driver 10 has a series connection of four FETs 16, 18, 20, and 22. For FETs 16, 18, 20, and 22, the term channel terminating electrode (CTE) will be used instead of the terms drain and source. This is valid because FETs of high density integrated circuits have a high degree of symmetry with respect to the gate element and each individual device would work equally as well if the connection of its CTEs were interchanged.

FET 16 is a P-channel device that has a first CTE connected to a positive voltage bus 23 of the integrated circuit, which is connected ultimately to VDD. A second CTE of FET 16 is connected to a first CTE of FET 18. FET 18 is also a P-channel device and has its second CTE connected to line 14 and a first CTE of FET 20. FET 20 is an N channel device that has its second CTE connected to a first CTE of FET 22. FET 22 is also an N-channel device and has its second CTE connected to the ground bus 24 of the integrated circuit, which is connected ultimately to VSS. Thus the channels of FETs 16–22 are connected in series together.

The gates of FETs 16 and 22 are connected together by line 25 and together provide the binary input from core logic (not shown) to the output driver 10.

Resistors R1 and R2 form a first voltage divider circuit between the positive voltage bus 23 and the ground voltage bus 24, which in the absence of noise and loading correspond to VDD and VSS respectively. The midpoint of the voltage divider is connected by line 26 to the gate of FET 18. The voltage, VREF1, at this midpoint is VSS + (VDD−VSS)(R2)/(R1+R2). Similarly, resistors R3 and R4 form a second voltage divider circuit between the positive voltage bus 23 and the ground voltage bus 24. The voltage, VREF2, is connected by line 28 to the gate of FET 20. The voltage, VREF2, at this midpoint is VSS + (VDD−VSS)(R4)/(R3+R4). All of these resistors may be diffused resistors. Further, VREF1 and VREF2 may be connected to other output driver circuits in order to save chip space because of the low current drawn by the FET gates.

The voltages VREF1 and VREF2 set the transconductances of FETs 18 and 20 respectively. These set transconductances will limit the amount of current that can be sourced from the positive voltage bus 23 through FETs 16 and 18 for a binary HIGH output and also the amount of current that may be sunk through FETs 20 and 22 to the ground bus 24 for a binary LOW output.

For a typical CMOS or TTL load, the current sourced to output pad 12 for a binary HIGH is low and not a problem for FETs 16 and 18 to conduct. For a binary LOW of a TTL load, however, the current sunk from output pad 12 is essentially a bipolar emitter current which can be a problem for FETs 20 and 22 to conduct, especially with the transconductance limiting provided by FET 20 in response to VREF2. Thus, the output driver 10 has an additional pulldown circuit as a part thereof.

The pulldown circuit has an inverter 30 that has its input connected to the output pad 12 by line 32. The output of inverter 30 is connected by line 34 to a first input of a two-input AND gate 36. The second input of two-input AND gate 36 is connected by line 38 to the binary input from the core logic. This is the same input that is connected to the gate of FET 22. The output of the two-input AND gate 36 is connected by line 40 to a gate of a FET 42. FET 42 is an N-channel device that is similar to FETs 20 and 22. One CTE of FET 42 is connected to line 14 and output pad 12. The second CTE of FET 42 is connected to the ground bus 24.

The threshold voltage for the input of inverter 30 is selected to be less than the logic LOW output level of the current limited FETs 20 and 22. Therefore, once FETs 20 and 22 pull the voltage of output pad 12 and line 14 down below the threshold voltage of the input of inverter 30, FET 42 will pull the voltage of output pad 12 and line 14 below the minimum logic LOW voltage to drive a TTL load. This assumes of course, that the binary input from the core logic is long enough in duration to allow inverter 30 and AND gate 36 time to logically respond.

Figure 2:
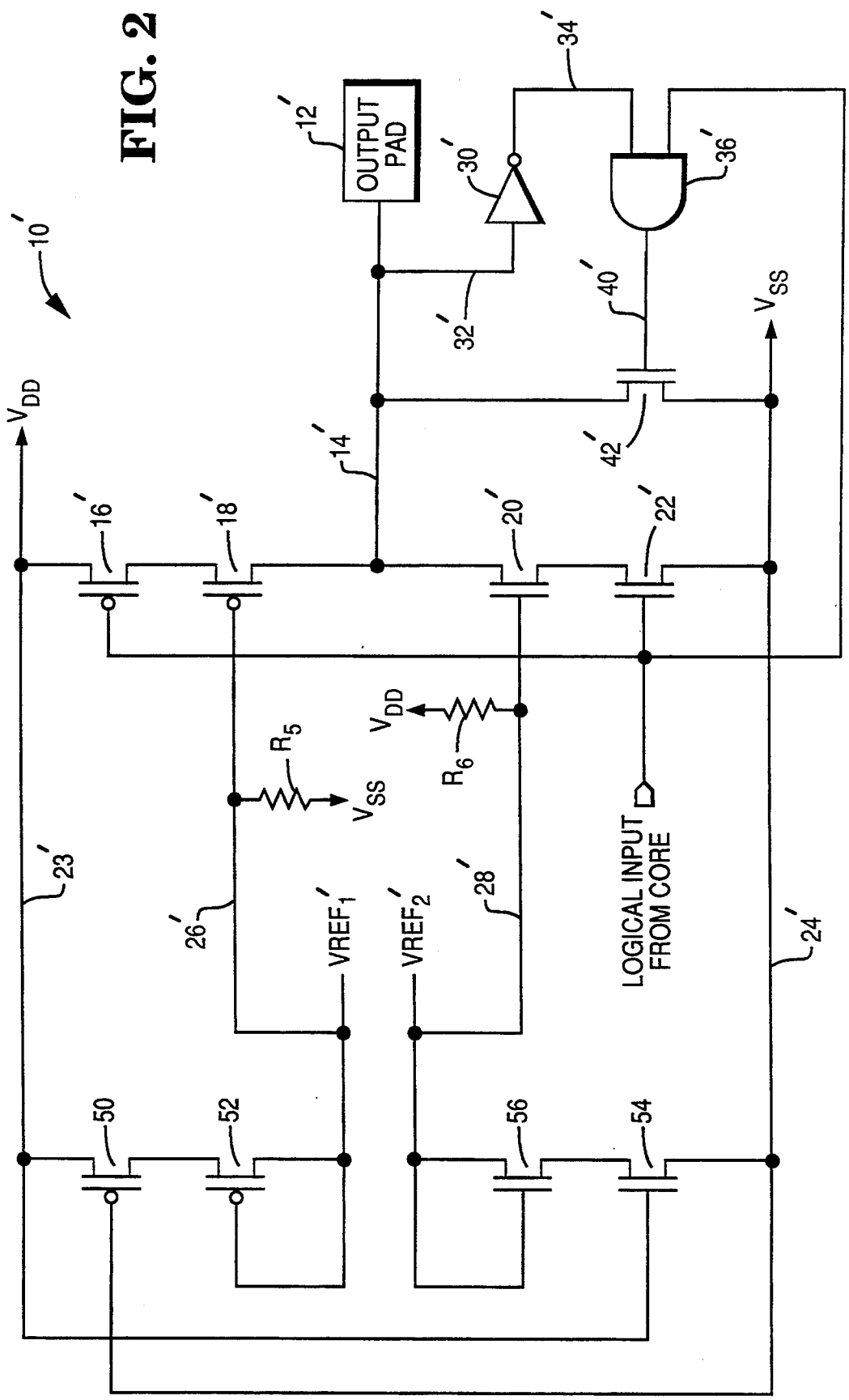
FIG. 2 is a schematic diagram of a second embodiment of an output driver circuit according to the present invention.

Referring now to FIG. 2, a second embodiment of the invention is shown. The CMOS current limited output driver 10' is substantially the same as the output driver 10 shown in FIG. 1 except that the resistors R1, R2, R3, and R4 are replaced by FETs 50, 52, 54, and 56 as a preferred way of deriving VREF1' and VREF2' from VDD and VSS.

FET 50 is a P-channel device that has a first CTE connected to the positive bus 23', a second CTE connected to a first CTE of FET 52, and a gate connected to the ground bus 24'. FET 52 is also a P-channel device and besides its first CTE mentioned previously it has its second CTE connected to its gate and to line 26', which is the VREF1' input to FET 18'. Resistor R5 is connected between line 26' and VSS, thereby forming a voltage divider with FETs 50 and 52 to provide VREF1'.

FET 54 is an N-channel device that has a first CTE connected to ground bus 24', a second CTE connected to a first CTE of FET 56, and a gate connected to the positive bus 23'. FET 56 is also an N-channel device and besides its first CTE mentioned previously has a second CTE that is connected to its gate and to line 28, which is the VREF2' line to FET 20'. Resistor R6 is connected between line 28' and VDD, thereby forming a voltage divider with FETs 54 and 56 to provide VREF2'.

FETs 50 and 54 are biased into a conducting state by the difference between the positive bus 23' and the ground bus 24'. The channel resistances of FETs 50 and 54 increases as the difference between positive bus 23' and ground bus 24' decreases and vice-versa, thus dynamically varying VREF1' and VREF2' to cancel the variation in output current due to variation in the manufacturing process. At the same time, FETs 52 and 56 are connected as diodes which provide fairly constant reference voltages VREF1' and VREF2'. Thus, FETs 52 and 56 provide compensation to FETs 18' and 22'. The overall effect of FETs 16' and 22' is more dynamic current limiting than would be available from the resistors R1, R2, R3, and R4 shown in FIG. 1.

The operation of the remainder of the circuit 10' is the same as the operation of the circuit 10 shown in FIG. 1. Just as VREF1 and VREF2 could be used for more than one output driver circuit 10, VREF1' and VREF2' can similarly be used for more than one output driver circuit 10'.

Figure 3:
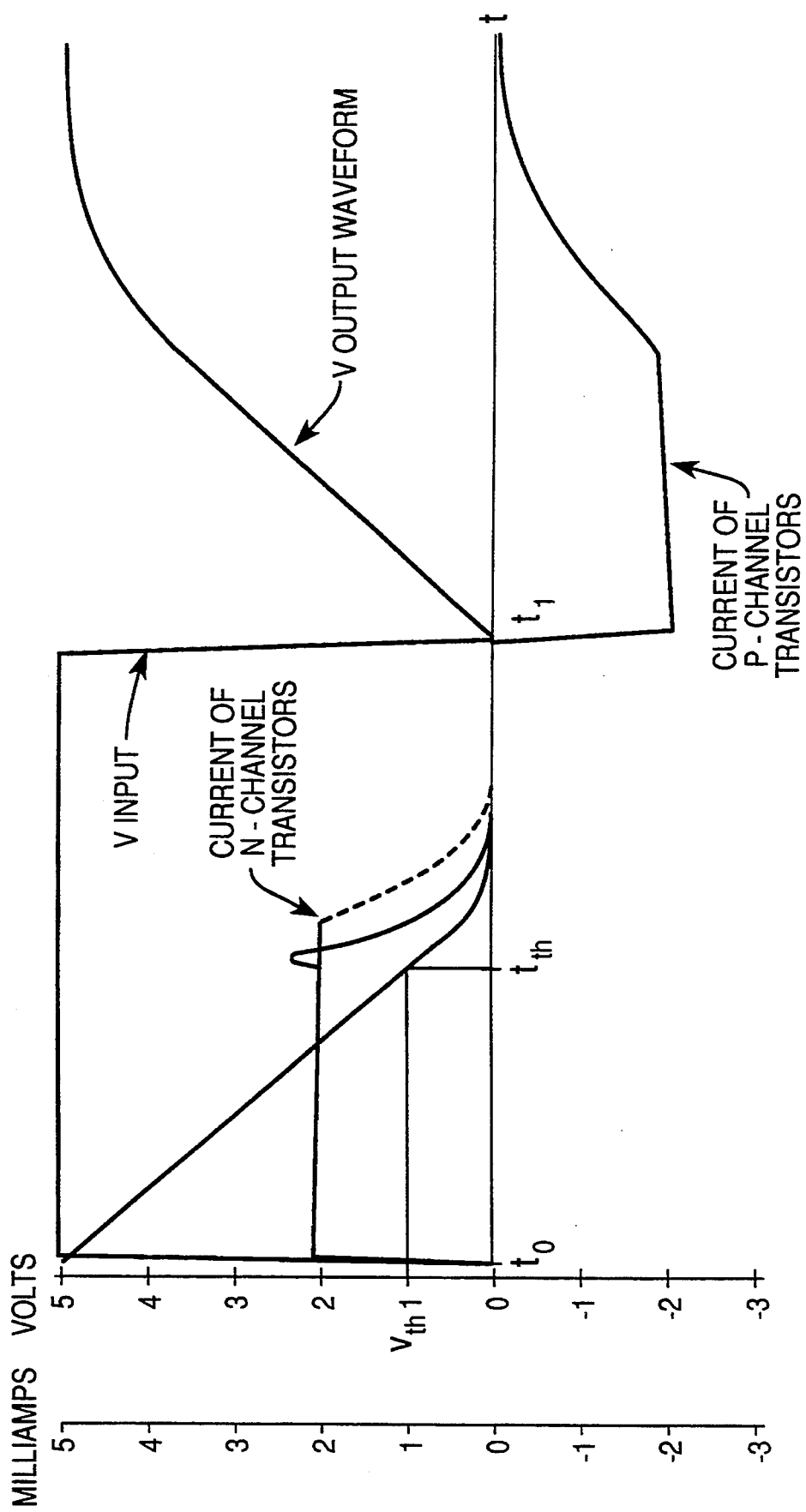
FIG. 3 is a plot of the voltage and current characteristics of the circuit diagrammed in FIG. 2.

Referring now to FIGS. 1, 2 and 3, a voltage and current plot of the output at pad 12' is shown for an input from the core logic. When the output voltage gets to the voltage threshold of the inverter 30 or 30' then FET 42 or 42' begin to conduct and briefly increase the amount of current sunk by the output driver 10 or 10' and then the current falls off very sharply because of the reduction in the cutoff voltage to the ground bus 24 or 24'. The amount of fall off is shown by the broken line.

Referring back to FIG. 2, the output driver 10' has a preferred application in gate array integrated circuits To provide the FETs 16', 18', 20', and 22' in series, a gate isolation fabrication technique is used in order to achieve the necessary isolation. The FETs 50, 52, 54, and 56 should be of the same construction and characteristics as the corresponding type from FETs 16', 18', 20' and 22' in order to give the best dynamic limiting.

Thus, it will now be understood that there has been disclosed a new and novel CMOS current limiting output driver. While the invention has been particularly illustrated and described with reference to preferred embodiments thereof, it will be understood by those skilled in the art that various changes in form, details, and applications may be made therein. For example, external VREF1 and VREF2 voltages could be used if desired. It is accordingly intended that the appended claims shall cover all such changes in form, details and applications which do not depart from the true spirit and scope of the invention.

What is claimed as new and desired to be secured by Letters Patent of the United States is:

1. An output driver circuit, comprising:
   an output pad;
   a current limited output driver connected between a positive supply voltage and a ground voltage, said output driver having a binary input, and also an output;
   said output of said output driver is connected to said output pad; and
   a pull down circuit connected to said output pad, and responsive to said output, to conduct additional current from said output pad to the ground voltage to attain a logic LOW level, wherein said output driver includes:
   an N-FET having its drain connected to said output pad, its source connected to said ground voltage and a gate;
   logic switching means for driving said N-FET into a conducting state if said output pad is being driven to a logic LOW level, wherein said logic switching means includes
   a binary inverter having an input connected to said output pad and an output;
   a two-input binary AND gate, having a first input connected to said binary inverter output, a second input connected to said binary input of said output driver; and
   an output of said two-input binary AND gate being connected to said gate of said N-FET.

2. The output driver circuit according to claim 1, wherein a threshold voltage for said binary inverter is less than the logic LOW level of said output driver.

3. The output driver circuit according to claim 1, wherein said output driver includes:
   a first reference voltage;
   a second reference voltage;
   a first P-FET having one channel electrode connected to the positive supply voltage, its gate connected to said binary input of said output driver, and a second channel electrode;
   a second P-FET having one channel electrode connected to said second channel electrode of said first P-FET, a gate connected to said first reference voltage, and a second channel electrode connected to said output pad;
   a first N-FET having one channel electrode connected to said second channel electrode of said second P-FET and said output pad, a gate connected to said second reference voltage, and a second channel electrode;
   a second N-FET having one channel electrode connected to said second channel electrode of said first N-FET, a gate connected to said binary input, and a second channel electrode connected to said ground voltage.

4. An output driver circuit, comprising:
   an output pad;
   a current limited output driver connected between a positive supply voltage and a ground voltage, said output driver having a binary input, and also an output;
   said output of said output driver is connected to said output pad; and
   a pull down circuit connected to said output pad, and responsive to said output, to conduct additional current from said output pad to the ground voltage to attain a logic LOW level, wherein said output driver includes:
   a first reference voltage;
   a second reference voltage;
   a first P-FET having one channel electrode connected to the positive supply voltage, its gate connected to said binary input of said output driver, and a second channel electrode;
   a second P-FET having one channel electrode connected to said second channel electrode of said first P-FET, a gate connected to said first reference voltage, and a second channel electrode connected to said output pad;
   a first N-FET having one channel electrode connected to said second channel electrode of said second P-FET and said output pad, a gate connected to said second reference voltage, and a second channel electrode;
   a second N-FET having one channel electrode connected to said second channel electrode of said first N-FET, a gate connected to said binary input, and a second channel electrode connected to ground.

5. The output driver circuit according to claim 4, wherein:
   said first reference voltage is provided by a first circuit including:
      a first P-FET having a first channel electrode connected to the positive supply voltage, a gate connected to said ground voltage, and a second channel electrode;
      a second P-FET having a first channel electrode connected to said second electrode of said first P-FET, a gate joined to a second channel electrode thereof forming a junction;
      a resistor connected between said junction and said ground voltage forming a voltage divider to provide said first reference voltage; and
      said junction of said second P-FET of said first circuit being connected to said gate of said second P-FET of said output driver to provide said first reference voltage thereto.

6. The output driver circuit according to claim 5, wherein:
   said second reference voltage is provided by a second circuit including:
      a first N-FET having a first channel electrode connected to said ground voltage, a gate connected to the positive supply voltage, and a second channel electrode;
      a second N-FET having a first channel electrode connected to said second electrode of said first N-FET, a gate joined to a second channel electrode thereof forming a junction;
      a resistor connected between said junction and said positive supply voltage forming a voltage divider to provide said second reference voltage; and
      said junction of said second N-FET of said second circuit being connected to said gate of said second N-FET of said output driver to provide said second reference voltage thereto.

* * * * *